United States Patent
Zhao et al.

(10) Patent No.: US 8,258,869 B2
(45) Date of Patent: Sep. 4, 2012

(54) LOW NOISE AMPLIFIER WITH CURRENT BLEEDING BRANCH

(75) Inventors: Zhongwu Zhao, Beijing (CN); Xiaodong Jin, Saratoga, CA (US)

(73) Assignee: Quintic Holdings, Santa Clara, CA (US)

( * ) Notice: Subject to any disclaimer, the term of this patent is extended or adjusted under 35 U.S.C. 154(b) by 61 days.

(21) Appl. No.: 12/894,144

(22) Filed: Sep. 30, 2010

(65) Prior Publication Data

US 2012/0025911 A1    Feb. 2, 2012

Related U.S. Application Data

(60) Provisional application No. 61/369,708, filed on Aug. 1, 2010.

(51) Int. Cl.
*H03F 3/45* (2006.01)
(52) U.S. Cl. .................................. 330/254; 330/311
(58) Field of Classification Search .................. 330/253, 330/254, 261, 257, 279, 311
See application file for complete search history.

(56) References Cited

U.S. PATENT DOCUMENTS

| | | | |
|---|---|---|---|
| 5,642,078 A | 6/1997 | Navabi et al. | |
| 6,424,222 B1 * | 7/2002 | Jeong et al. | 330/278 |
| 6,563,382 B1 * | 5/2003 | Yang | 330/254 |
| 7,557,657 B2 * | 7/2009 | Quoc et al. | 330/254 |
| 7,633,337 B2 * | 12/2009 | Nam et al. | 330/254 |

\* cited by examiner

*Primary Examiner* — Khanh V Nguyen
(74) *Attorney, Agent, or Firm* — Blairtech Solution LLC

(57) ABSTRACT

An LNA circuit for providing a wide range of gain while maintaining the output headroom. In a radio frequency (RF) receiver, the signal received by the receiver may be extremely small. For a transmitter in a short distance, the received signal may be relatively strong. A low power amplifier usually is used to amplify the input signal. The LNA has to be designed to accommodate a wide range of gain. A convention LNA circuit supporting a wide range of gain often suffers from reduced output headroom due to increased current through the load resistor. The present invention discloses the use of current bleeding branch to allow a portion of current to flow through the current bleeding branch and consequently reduces the current that would have flown through the load resistor. Consequently, the voltage across the load resistor may be maintained low to allow adequate output headroom.

10 Claims, 5 Drawing Sheets

LOW NOISE AMPLIFIER WITH CURRENT BLEEDING BRANCH

CROSS REFERENCE TO RELATED APPLICATIONS

The present invention claims priority to U.S. Provisional Patent Application No. 61/369,708, filed Aug. 1, 2010, entitled "Low Noise Amplifier with Current Bleeding Branch." The U.S. Provisional Patent Application is hereby incorporated by reference in its entirety.

FIELD OF THE INVENTION

The present invention relates to radio receivers. In particular, the present invention relates to the low-noise amplifier with a current bleeding branch for the radio receiver to operate with a wide range of input signal levels.

BACKGROUND

In a radio frequency (RF) receiver, the signal received by an antenna usually is extremely small. For example, the RF signal received by an antenna for a TV signal may be as low as several micro-volts. The small received signal often is amplified by a low-noise amplifier (LNA) typically with low noise figure (NF) in order to ensure system performance in terms of signal to noise ratio (SNR). The LNA is one of the critical building blocks in an RF system since the RF signal received is amplified by the LNA and the performance of the LNA has a major impact on the system performance. While the LNA is required to amplify received RF signals which may have very small amplitude, the LNA may also encounter channels having a strong received signal. For these channels, the LNA only needs to provide a small degree of amplification or even to attenuate the signal; otherwise the amplified signal may be saturated. Furthermore, in a mobile environment, the received signal from a channel may fluctuate significantly depending on the distance between the transmitter and the receiver as well as other receiving conditions. Therefore, the LNA has to accommodate a wide range of input signal levels adaptively. Thus, LNA has to be designed to provide a wide range of gains without affecting its performance.

According to the above discussion, the LNA must be capable of providing a gain large enough to amplify a weak signal as well as a small gain or no gain for a strong signal at the LNA input. At the mean time, the LNA must have a low noise figure to amplify signal without introducing large distortion to ensure the signal quality. Typically, a larger gain is associated with a lower noise figure and a higher current for the current source used by the LNA circuit. The signal strength at the input of the LNA may vary for various reasons, such as performance of the antenna, the distance of the mobile device from the transmitter and the receiving environment. Therefore, the LNA design must provide a variable gain to adapt to the varying signal. A higher gain should be used for a smaller input signal and a lower gain should be used for a larger input signal. Usually an automatic gain control (AGC) is used to automatically set a proper gain for an input so that the amplified input signal will be within a range suited for subsequent processing. If the gain is not properly set, it may lead to under amplification, particularly for a weak input signal, which may affect the performance or operation of the system; or it may lead to amplifier saturation, particularly for a strong input signal which will cause signal distortion and degrade system performance. A conventional method of increasing the gain of the LNA is to increase the transconductance gm of the input device or the load resistance. Typical method of increasing the transconductance gm of the input device is to increase the bias current of the input device. Also, the transconductance gm can also be increased by simply increasing the size of the input device. Nevertheless, this would require multiple input devices with various sizes to implement various gains. Furthermore, the linearity will be sacrificed by this method. Either increasing the bias current or increasing the load resistance will increase the voltage across the load resistor. This implies that a higher operating voltage is required for the LNA, which is undesirable particularly for portable applications.

Both the noise figure and linearity are two important properties of the LNA besides the variable gain. A low noise figure is required for a weak signal at the LNA input; otherwise the noise from the LNA may become noticeable or even dominant in the amplified input signal. Good linearity is particularly important for the case of strong interference in the input signal; otherwise images associated with the interference signal may fall into the band of the intended signal. As described previously, increasing the size of the input device can increase the LNA gain. However, it will decrease the overdrive voltage of the input devices and consequently decrease the linearity of LNA. Increasing the bias current can improve both the noise figure and the linearity. However, the increased power dissipation due to higher bias current becomes a major concern for portable applications. Therefore, it always becomes a tradeoff between system performance and power/cost. It is desirable to design an LNA that provides a wide range of gains while maintaining high performance without the drawbacks of increased power consumption and/or cost.

BRIEF SUMMARY OF THE INVENTION

An LNA circuit to provide a wide range of gains while maintaining output headroom is disclosed. In one embodiment according to the present invention, the LNA circuit includes a current bleeding branch to allow a portion of the current from the current source to flow through the current bleeding branch so as to reduce the current through the load resistor. In one embodiment according to the present invention, the current bleeding branch includes a transistor configured as a current source load, wherein the bias of the current bleeding transistor is controlled by a control transistor. Furthermore, a current control signal is applied to the control transistor to set a desired bias for the current bleeding transistor. In another embodiment according to the present invention, the LNA circuit with a wide range of gains is disclosed for differential signals, wherein the LNA comprises a pair of current bleeding branches and a differential LNA circuit. The pair of current bleeding branches is coupled to the respective load resistors in parallel to allow a portion of the current from the current source to flow through the pair of current bleeding branches.

In yet another embodiment according to the present invention, the LNA circuit is disclosed for differential signals having multiple gain modes, wherein the LNA with a wide range of gain while maintaining the output headroom comprises a pair of current bleeding branches and a differential multiple-gain mode LNA circuit. The pair of current bleeding branches is coupled to the respective load resistors and switched load resistors in parallel to allow a portion of the current of the current source to flow through the pair of current bleeding branches. The current source implemented by a transistor usually produces additional noise due to the noise associated with the current-source transistor. To alleviate the noise associated with the current-source transistor, another embodiment according to the present invention is disclosed wherein the current bleeding branch further comprises a degeneration resistor connected in serial with the current bleeding transistor.

DETAILED DESCRIPTION OF THE INVENTION

Figure 1:
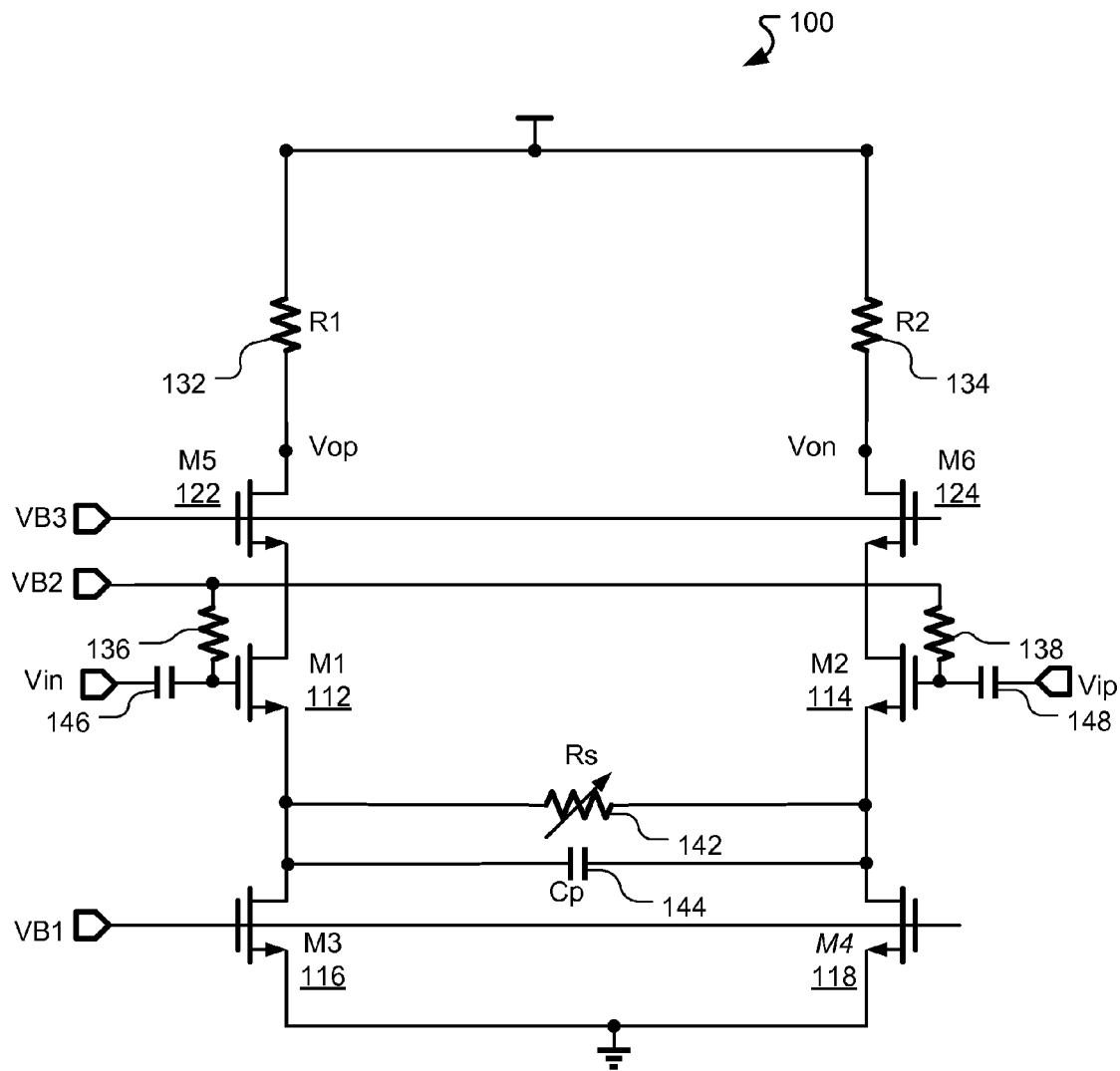
FIG. 1 illustrates a conventional differential low power amplifier circuit.

FIG. 1 illustrates a conventional implementation of differential low-power amplifier 100 without a current bleeding circuit. The circuit has been widely used as a low-noise amplifier (LNA) for broad band RF receivers. The RF inputs $V_{in}$ and $V_{ip}$ are AC coupled to the amplifier inputs through two respective AC coupling capacitors 146 and 148. The amplifier can also be configured as a single-ended input amplifier when one of the two inputs is AC grounded. M1 112 and M2 114 are input transistors and Rs 142 is the source degeneration resistor for adjusting the gain of the LNA. $C_p$ 144 is the parasitic capacitor associated with the input transistors M1 112 and M2 114 which may limit the effect of source degeneration of resistor Rs 142 at high frequencies. M3 116 and M4 118 are transistors used as current sources while the transistor pair M5 122 and M6 124 forms a cascode stage which decouples the inputs and the outputs. $V_{B1}$, $V_{B2}$, and $V_{B3}$ are DC bias voltages which provide for appropriate DC operating voltages of the LNA. $V_{B1}$ provides the bias voltage to the current sources M3 116 and M4 118. $V_{B2}$ provides the bias voltage to the gates of the input transistors M1 112 and M2 114 through respective resistors 136 and 138. $V_{B3}$ provides the bias voltage to the cascode transistors M5 122 and M6 124. Resistors R1 132 and R2 134 are used as the load resistors of the LNA circuit and the output signals $V_{on}$ and $V_{op}$ are coupled to the respective load resistors.

While the circuit shown in FIG. 1 is intended for differential signals, it can be configured to accommodate single-ended signals as well. When the circuit of FIG. 1 is used for a single-ended signal, the input signal is coupled to one of the input ports, i.e., $V_{in}$ or $V_{ip}$ and the other port is connected to ground. Nevertheless, there also exist LNA circuits dedicated to single-ended signal wherein the single-ended LNA circuits comprise roughly half of the components of FIG. 1. The present invention is applicable to both single-ended LNA as well as differential LNA.

For the LNA circuit shown in FIG. 1, the voltage gain can be increased by either increasing the equivalent Gm of the input stage, which contains the input transistors M1 112, M2 114 and the source degeneration resistor Rs 142 or increasing the load resistance of load resistors R1 132 and R2 134. The equivalent Gm of input stage can be increased by increasing the transconductance gm of the input transistors M1 112 and M2 114 and/or by decreasing the resistance of source degeneration resistor Rs 142. The transconductance gm of the input transistors M1 112 and M2 114 can be increased by increasing the number of the current source M3 116 and M4 118. to increase the current flowing through the drains of the source transistors M1 112 and M2 114. Increasing the current of the input transistors M1 112 and M2 114 will cause an increase in power consumption which is not desirable particularly for mobile applications. Alternatively, the transconductance gm can be increased by increasing the size of the input transistors M1 112 and M2 114. Nevertheless, increasing transconductance gm by increasing input transistor size is not a preferred alternative since it implies that a number of input transistors with various transistor sizes will be needed to implement the respective various gains of the LNA. So, increasing the load resistance of load resistors R1 132 and R2 134 will be a right choice. According to the conventional LNA design shown in FIG. 1, increasing the resistance of the load resistors R1 132 and R2 134 will cause voltage increase across the load resistors R1 132 and R2 134 and consequently reduces the output headroom. The current bleeding technique described hereafter allows increased resistance of load resistors R1 132 and R2 134 without causing increase in load voltage. Consequently, the LNA gain is increased via increasing the resistance of load resistors without reducing the output headroom.

Figure 2:
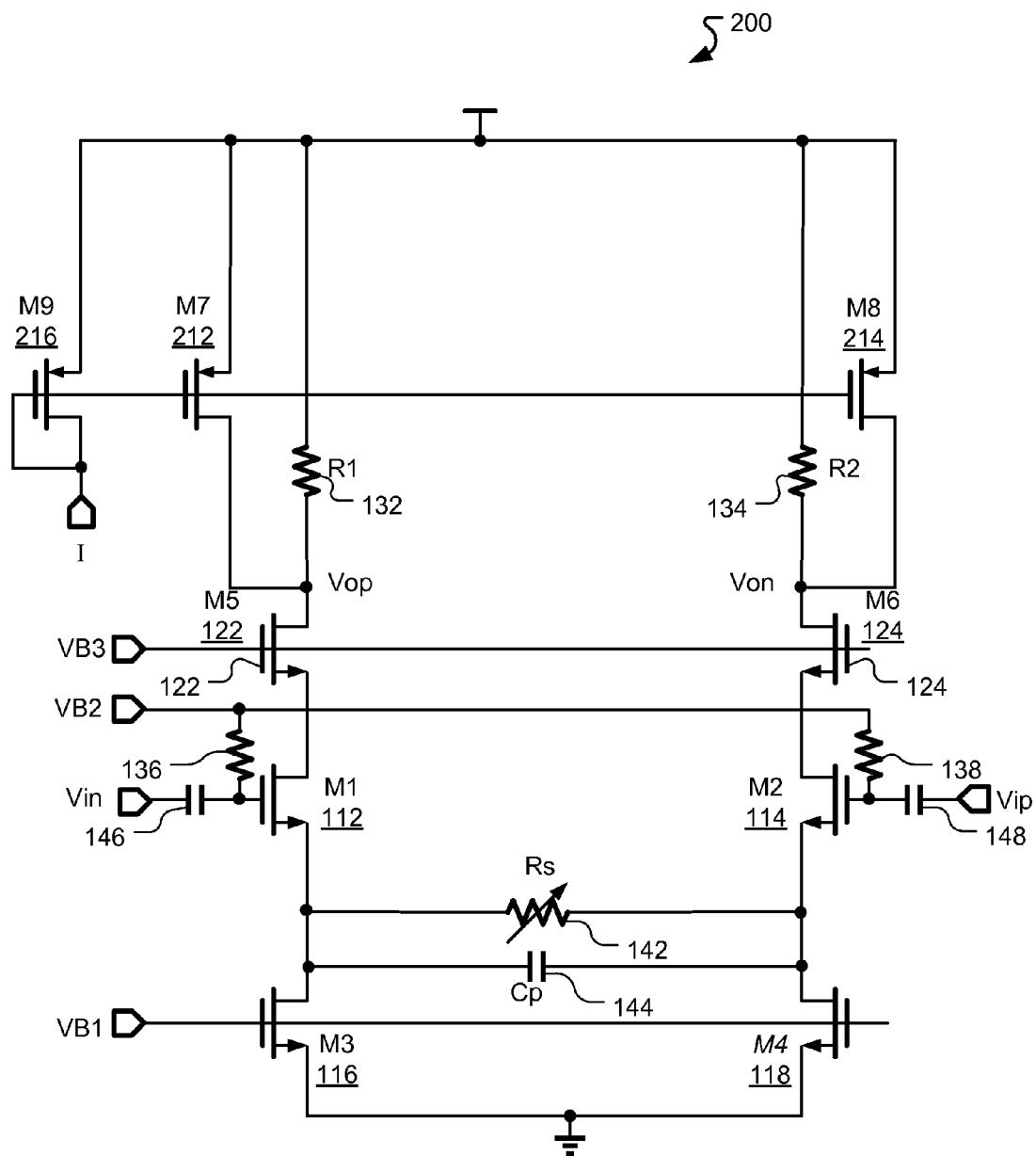
FIG. 2 illustrates an exemplary differential low power amplifier circuit with current bleeding branches according to one embodiment of the present invention, wherein the current bleeding circuit is connected to respective load resistors in parallel.

FIG. 2 depicts an exemplary circuit 200 for the differential LNA with current bleeding branches according to an embodiment of the present invention. In order to avoid reduced output headroom due to increased voltage drop across the load resistors R1 132 and R2 134, the current bleeding circuit of FIG. 2 allows a portion of the current to bypass the load resistors R1 132 and R2 134. As shown in FIG. 2, a pair of load transistors M7 212 and M8 214 is used as current bleed branches. The load transistors M7 212 and M8 214 function as current source connected in parallel with respective load resistors R1 132 and R2 134 to allow a portion of the load current to bleed through the respective current bleeding transistors M7 212 and M8 214. The load transistor pair M7 212 and M8 214 is carefully designed to match their characteristics and the load transistor pair is also called current mirror load transistors. The resistance across the drain and the source of respective transistors M7 212 and M8 214 is controlled by the bias supplied by the control transistor M9 216, which is in turn controlled by a current control signal I. Depending on the amount of desired current bleeding, the current control signal, I can be adjusted to provide for a desired bias to the load transistors. The current control signal I controls the current of the control transistor M9 216 and thus controls load transistors M7 212 and M8 214 of the current bleeding branches. The purpose of the current control signal I is to control the current through the current mirror branches, namely M7 212 and M8 214 so that appropriate output common mode is maintained. In FIG. 2, transistors M7, M8 and M9 have a device type complementary to other transistors of the LNA, i.e., M7 through M9 are PMOS transistors while M1 through M6 are NMOS transistors. Though M1 through M6 may use PMOS transistors and M7 through M9 may use NMOS transistors, however such implementation is not common since the NMOS transistor can provide larger transconductance gm than the PMOS transistor at a given current level.

The current bleeding branches, as shown in FIG. 2, illustrate one exemplary implementation according to the present invention. Other implementation of the current bleeding branches is also possible, and those skilled in the art will understand that such variations are possible without departing from the spirit and scope of the invention, given this description.

Figure 3:
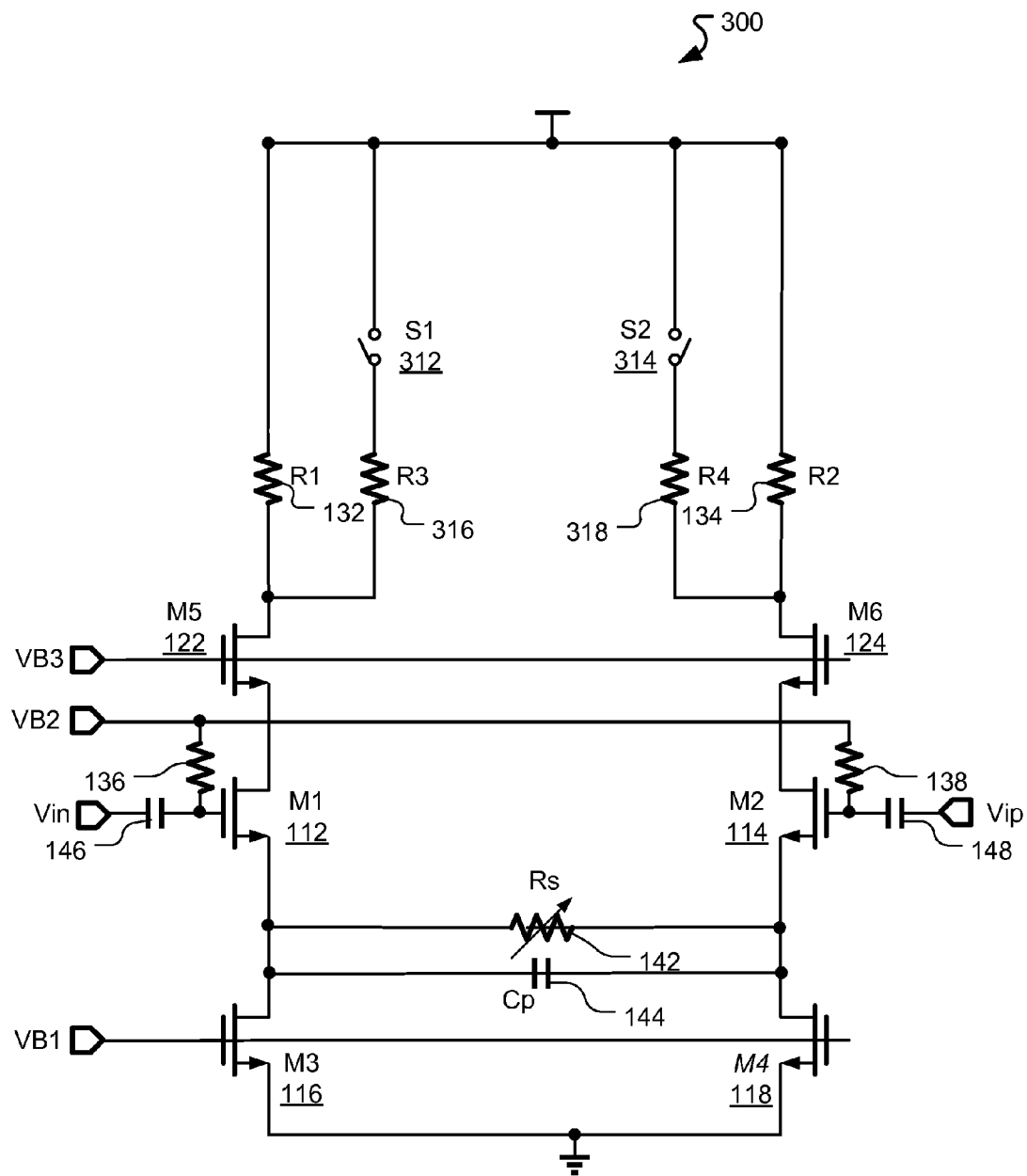
FIG. 3 illustrates an exemplary differential low power amplifier circuit with multiple gain modes.

Often the LNA has to be designed to cover a wide range of gain. In a typical implementation, the LNA may support multiple gain modes, such as a high gain mode and a low gain mode, which are realized by adjusting the source degeneration resistor Rs 142. However the parasitic capacitor Cp 144 will become dominant at high frequencies. Therefore, changing the resistance of the source degeneration resistor Rs will become ineffective for gain adjustment. Consequently, switchable branches of load resistors R3 316 and R4 318 are used with respective switches S1 312 and S2 314 as shown in FIG. 3 to implement multiple gain modes. At a respective gain mode, the source resistor Rs is used to adjust gain for the mode selected. When the switches S1 312 and S2 314 are open, the circuit of FIG. 3 is identical to that of FIG. 1. When the switches S1 312 and S2 314 are closed, the circuit of FIG. 3 is similar to that of FIG. 1 with effective load resistance reduced due to the load resistors R1 132 and R2 134 and the switched load resistors R3 316 and R4 318 are connected in parallel respectively. In either case, an increase in the drain current through input transistors M1 112 and M2 114 will cause the voltage across the respective load resistors to increase. Consequently, the same issue of reduced output headroom as that of FIG. 1 will arise.

Figure 4:
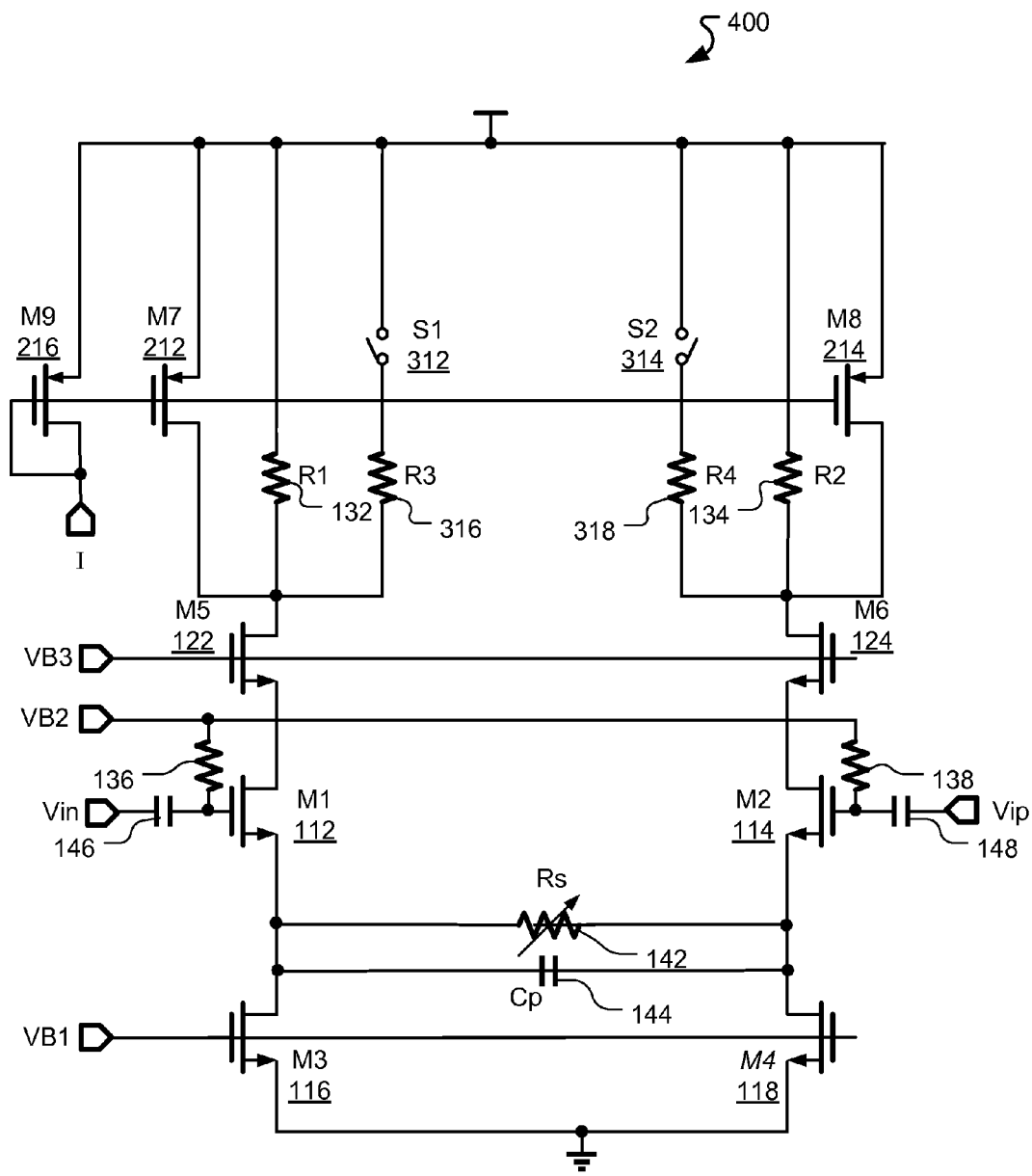
FIG. 4 illustrates an exemplary differential multiple-gain mode low power amplifier circuit with current bleeding branches according to one embodiment of the present invention, wherein the current bleeding circuit is connected to respective load resistors and switched load resistors in parallel.

The current bleeding circuit shown in FIG. 2 can be applied to the multiple-gain mode LNA circuit as well. One embodiment according to the present invention is shown in FIG. 4. The LNA circuit 400 with current bleeding branches for multiple gain modes utilizes a pair of load transistors M7 212 and M8 214 along with a control transistor M9 216 as the current bleed branches. The transistors M7 212 and M8 214 function as resistive loads connected in parallel with respective load resistors R1 132 and R2 134, when switches S1 312 and S2 314 are open. The transistors M7 212 and M8 214 function as current source connected in parallel with respective equivalent resistor R1//R3 and equivalent resistor R2//R4 respectively, to allow a portion of the load current to bleed through the transistors M7 212 and M8 214. R1//R3 represents the effective resistor of parallelly connected R1 132 and R3 316 and R2//R4 represents the effective resistor of parallelly connected R2 134 and R4 318. For the same reason as described for the circuit of FIG. 2, the current bleeding method can solve the problem of reduced output headroom by allowing a portion of the source current to flow through the bleeding branches.

Figure 5:
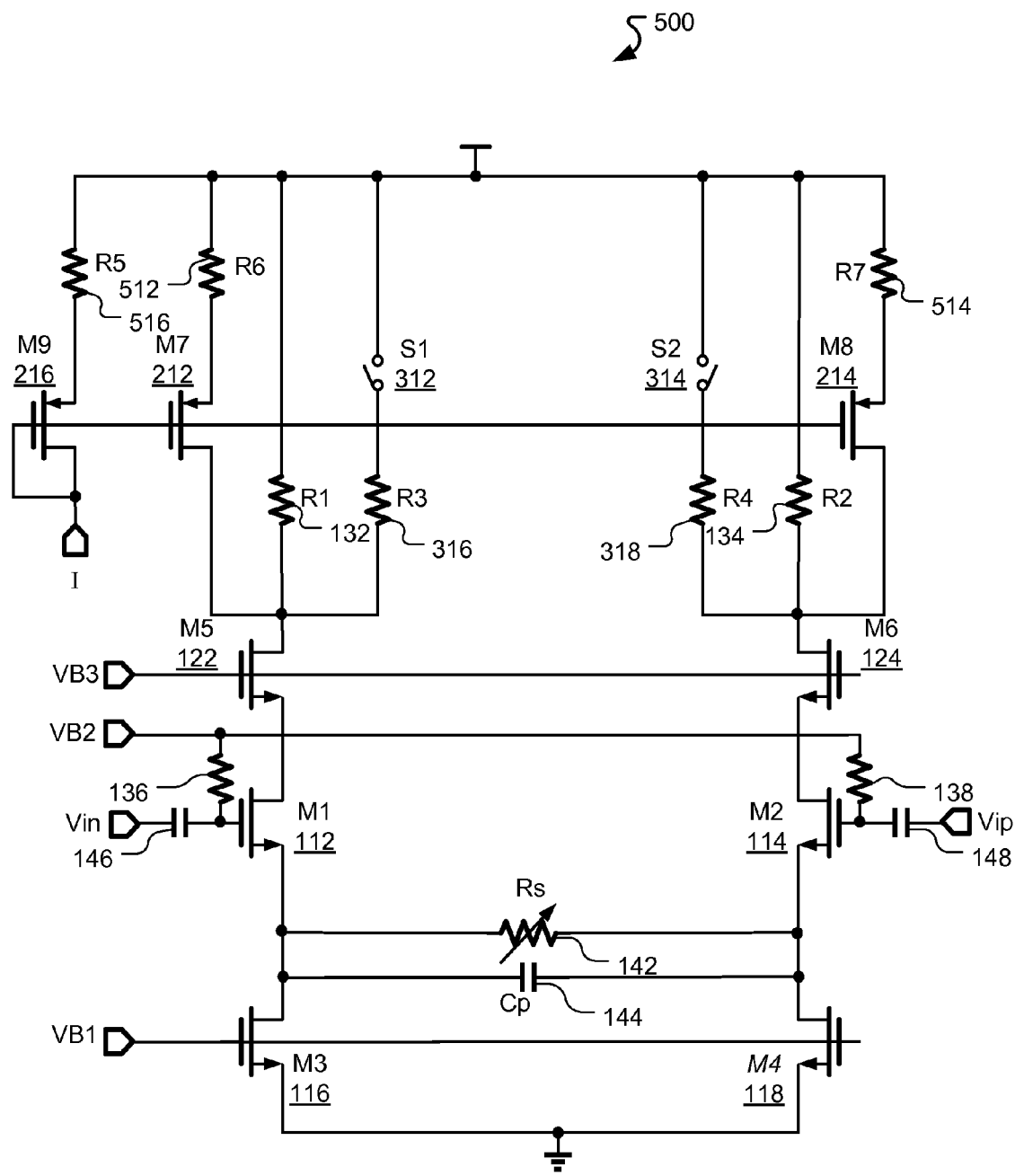
FIG. 5 illustrates an exemplary differential low power amplifier circuit with current bleeding branches according to one embodiment of the present invention, wherein each current bleeding source includes a respective degeneration resistor.

In the case of low noise applications, the noise associated with the drain current of the current bleed transistors may degrade the performance of the LNA. To relieve this problem, low transconductance transistors should be used to implement the bleeding transistors M7 212 and M8 214. For fixed DC current, the overdrive voltage of the current bleeding transistors M7 212 and M8 214 should be designed as high as possible. Source degeneration resistors can be used to further improve the noise performance of the circuit. FIG. 5 depicts an exemplary implementation of the LNA circuit 500 with current bleeding branches and degeneration resistor to reduce noise. The noise contribution of load transistors M7 212 and M8 214 can be substantially reduced by the respective degeneration resistors R6 512 and R7 514. Similarly, a degeneration resistor R5 516 is used with control transistor M9 216. Though the noise of resistors R6 512 and R7 514 will appear at the input of the low noise amplifier, the multiple-gain mode LNA circuit 500 of FIG. 5 achieves noise reduction compared with the LNA circuit of FIG. 4. At the meanwhile, the output resistance of the current source is increased by the source degeneration resistor. As a consequence, the effect of the finite output resistance of the current source to the parallel load is reduced.

The invention may be embodied in other specific forms without departing from its spirit or essential characteristics. The described examples are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A low-noise amplifier comprising:
   an input transconductance stage that receives an input voltage signal;
   a cascode transistor pair that is coupled to the input transconductance stage to generate an amplified output signal; and
   an output load stage coupled to the amplified output signal, wherein the output load stage comprises a first load resistor coupled to an adjustable current source branch in parallel; and
   wherein the output load stage further comprises a switchable branch coupled to the first load resistor and the adjustable current source branch in parallel, wherein the switchable branch comprises a second load resistor connected to a load switch in serial to select a gain mode.

2. A low-noise amplifier comprising:
   an input transconductance stage that receives an input voltage signal;
   a cascode transistor pair that is coupled to the input transconductance stage to generate an amplified output signal; and
   an output load stage coupled to the amplified output signal, wherein the output load stage comprises a first load resistor coupled to an adjustable current source branch in parallel;
   wherein the adjustable current source branch comprises a current mirror load transistor pair; and
   wherein the adjustable current source branch further comprises a first degeneration resistor connected to the current mirror load transistor in serial.

3. The low-noise amplifier of claim 2, wherein the output load stage further comprises a control transistor to supply a control signal to a gate of the current mirror load transistor pair to adjust a first current sourced by the current mirror load transistor pair, wherein source current of the control transistor is controlled by a control current.

4. The low-noise amplifier of claim 3, wherein the control transistor is connected to a second degeneration resistor in serial.

5. A method for gain adjustable low-noise amplifier, the method comprising:
   providing an input transconductance stage to receive an input voltage signal;
   coupling a cascode transistor pair to the input transconductance stage to generate an amplified output signal;
   coupling a first load resistor to the amplified output signal;
   coupling an adjustable current source branch to the first load resistor in parallel;
   adjusting DC operation point of the amplified output signal according to a change of equivalent resistance associated with the load resistor and the adjustable current source branch to obtain a desired gain of the low-noise amplifier, wherein the adjustable current source branch comprises a current mirror load transistor pair having a gate coupled to a control signal for adjusting first current of the current mirror load transistor pair; and providing a switchable impedance branch coupled to the first load resistor in parallel to select a gain mode.

6. The method of claim 5, further comprising:

providing a control transistor to generate the control signal coupled to the gate adjusting first current sourced by the current mirror load transistor pair.

7. The method of claim 6, further comprising:

providing a control current to the control transistor to generate the control signal.

8. A method for gain adjustable low-noise amplifier, the method comprising:

providing an input transconductance stage to receive an input voltage signal;

coupling a cascode transistor pair to the input transconductance stage to generate an amplified output signal;

coupling a first load resistor to the amplified output signal;

coupling an adjustable current source branch to the first load resistor in parallel;

adjusting DC operation point of the amplified output signal according to a change of equivalent resistance associated with the load resistor and the adjustable current source branch to obtain a desired gain of the low-noise amplifier, wherein the adjustable current source branch comprises a current mirror load transistor pair having a gate coupled to a control signal for adjusting first current of the current mirror load transistor pair; and providing a first degeneration resistor coupled to the current mirror load transistor to reduce noise associated with the current mirror load transistor pair and increase output resistance of the current mirror load transistor pair.

9. The method of claim 8, further comprising:

providing a control transistor to generate the control signal coupled to the gate adjusting first current sourced by the current mirror load transistor pair.

10. The method of claim 9, further comprising:

providing a control current to the control transistor to generate the control signal.

* * * * *